United States Patent [19]

Coenen

[11] Patent Number: 5,283,577
[45] Date of Patent: Feb. 1, 1994

[54] WORD WIDTH REDUCTION SYSTEM FOR VIDEOSIGNAL PROCESSING AND TRANSMISSION

[75] Inventor: Antonius J. R. M. Coenen, Oudenbos, Netherlands

[73] Assignee: Technische Universiteit Delft, Delft, Netherlands

[21] Appl. No.: 838,739

[22] PCT Filed: Sep. 20, 1990

[86] PCT No.: PCT/NL90/00137
§ 371 Date: Mar. 11, 1992
§ 102(e) Date: Mar. 11, 1992

[87] PCT Pub. No.: WO91/04611
PCT Pub. Date: Apr. 4, 1991

[30] Foreign Application Priority Data
Sep. 21, 1989 [NL] Netherlands .......................... 8902368
Nov. 7, 1989 [NL] Netherlands .......................... 8902751

[51] Int. Cl.$^5$ .............................................. H03M 7/00
[52] U.S. Cl. .......................................... 341/95; 341/77
[58] Field of Search .................... 341/77, 95, 143, 144, 341/145

[56] References Cited

U.S. PATENT DOCUMENTS

| | | | |
|---|---|---|---|
| 4,006,475 | 2/1977 | Candy et al. | 341/145 |
| 4,467,316 | 8/1984 | Musmann et al. | 341/144 |
| 4,593,271 | 6/1986 | Candy | 341/131 |
| 4,994,804 | 2/1991 | Sakaguchi | 341/143 |

Primary Examiner—Marc S. Hoff
Attorney, Agent, or Firm—Bachman & LaPointe

[57] ABSTRACT

System for converting a PCM input signal with uniform noise spectrum, comprising a series of digital words each of K-bits appearing with a predetermined repetition frequency, into an PCM output signal with a non-uniform noise spectrum comprising a series of digital words each of L-bits, L being small than K. The system comprises at least a 1-bit coder embodied to provide a shaped noise profile and to convert the K-L least significant bits of each word from the input signal into a series of 1-bit words, and an accumulator for combining said 1-bit words with the L most significant bits resulting into the desired PCM output signal. The frequency with which said K-L least significant bits of the words of the input signal are converted by said 1-bit coder is equal to said earlier mentioned repetition frequency.

13 Claims, 10 Drawing Sheets

WORD WIDTH REDUCTION SYSTEM FOR VIDEOSIGNAL PROCESSING AND TRANSMISSION

The invention relates to a system for converting a PCM input signal with uniform noise spectrum, comprising a series of digital words each of K-bits appearing with a predetermined repetition frequency, into an PCM output signal with a non-uniform noise spectrum comprising a series of digital words each of L-bits, L being small than K which system comprises at least a 1-bit coder embodied to provide a shaped noise profile and to convert the K-L least significant bits of each word from the input signal into a series of 1-bit words, and an accumulator for combining said 1-bit words with the L most significant bits resulting into the desired PCM output signal.

Such a system is described in the U.S. Pat. No. 4,006,475. This patent publication describes in fact a further development of the system as described in U.S. Pat. No. 4,467,316. In both prior art systems use is made of "oversampling" because the frequency with which the K-L least significant bits of each word from the input signal are converted, is several times higher than the repetition frequency with which the words appear in the PCM input signal. In the system described in U.S. Pat. No. 4,467,316 use is made of a first order filter in the coder, resulting into the fact that the output signal has a non-uniform noise spectrum. Especially a shift is created from the lower frequency part to the higher frequency part of the spectrum with the result that on balance after filtering the baseband (the band which contains the desired useful signal parts) at the output of the system by means of a suitable filter the signal-noise ratio in the baseband is improved. However, it has appeared that this improvement is at the expense of additional oscillations in the output signal.

A further development is described in the U.S. Pat. No. 4,593,271. The therein described system comprises besides the already mentioned 1-bit coder a second 1-bit coder which is used for coding the residual value words generated by the first 1-bit coder. The resulting series of 1-bit words is, after differentiation in a thereto suitable circuit, combined with the series of signals at the output of the first summing circuit and is thereafter supplied to a filter to filter out the desired baseband. Just as the first 1-bit coder in this configuration also the second 1-bit coder operates at a frequency which is a multiple of the repetition frequency the PCM input signal.

Measurements have shown that with such a cascade circuit a better result can be obtained then with the embodiment comprising only one 1-bit coder as described in the above-mentioned U.S. Pat. No. 4,467,316 without introducing lots of other disadvantages. According to measurements the cascade circuit provides a shaping of the quantization noise with a spectrum having a slope of +12 dB/octave.

All the prior art systems are ultimately destined to convert the incoming PCM signal into an analog output signal, especially an audiosignal. If the PCM input signal comprises words with a relative large number of bits then the conversion of such a signal would require an D/A-converter with a relatively large number of discrete levels. Such converters are hard to realize. By using the above described systems words can be used with a smaller number of bits (although appearing with a much larger repetition frequency than in the original PCM signal), which can be converted into an analog output signal by means of a relatively simple D/A-converter.

In all these prior art systems consistently use is made of oversampling to be able to provide information, stored in the binary levels which are not present in the output signal anymore, in another manner to the D/A-converter. The result thereof is that even with a relatively low repetition frequency in the PCM input signal very high switching frequencies may appear in the system itself.

In U.S. Pat. No. 4,467,316 the attention is drawn in column 2, lines 45-49 to a PCM audio system functioning with a 16 bit converter and a sampling frequency of 50 kHz. Because of the applied oversampling in the accumulator a frequency will be necessary in the Giga-Hertz range. For another embodiment, describes as example in column 7, line 30, a switching frequency of 204.8 MHz is mentioned. All these higher frequencies which are above the ultimately desired baseband (in which the desired audiosignal is present) are filtered out by a lowpass filter at the output.

Up to now these relatively high switching frequencies have formed an significant obstruction for applying these techniques to videosignals. If for a videosignal use is made of the internationally standardized sampling frequency of 13.5 MHz and if words of 8 bit are used then, because of the necessary oversampling, a switching frequency of some tens GHz will be necessary to convert this signal with one of the prior art means.

An object of the invention is now to indicate in which manner, especially for videotransmission applications, use can be made of 1-bit coders for processing an PCM video input signal in such a manner that a reduction of the necessary transmission bandwidth can be realized thereby maintaining, however, an acceptable perception quality and without the necessity to use very high switching frequencies.

In agreement with said object the invention now provides a system for converting a PCM input signal with uniform noise spectrum, comprising a series of digital words each of K-bits appearing with a predetermined repetition frequency, into an PCM output signal with a non-uniform noise spectrum comprising a series of digital words each of L-bits, L being small than K which system comprises at least a 1-bit coder embodied to provide a shaped noise profile and to convert the K-L least significant bits of each word from the input signal into a series of 1-bit words, and an accumulator for combining said 1-bit words with the L most significant bits resulting into the desired PCM output signal, characterized in that the frequency with which said K-L least significant bits of the words of the input signal are converted by said 1-bit coder is equal to said earlier mentioned repetition frequency.

The system according to the invention does not use oversampling. At the receiving end of the transmission path, onto which the invention is applied, the used apparatuses do not have to be adapted in any way. The signal, received at the reception end through the transmission path can be processed by the usual PCM decoder. At the transmission side relatively low switching frequencies are necessary in the coder, because in principle these switching frequencies are equal to the repetition frequency in the PCM input signal.

An important additional advantage is that, when the invention is applied, after a bit error on the transmission path no bit error propagation will occur, in contrast to other prior art systems for restricting the number of bits in a videosignal. Bit error propagation will in general lead to annoying disturbing lines in the displayed picture. Said disturbing lines will not appear when the invention is applied, because an eventual bit error has at the very worsed only influence on one single pixel.

The invention uses the fact that the human eyesight as it were comprises a filter for higher video frequencies. In a videosignal the larger part of the relevant information which is observable for the human eye is situated in the lower frequency section of the base band. Disturbing signals or noise in the higher frequency section of the baseband are not or hardly visible if the video information is displayed to a viewer. Because with the system according to the invention a shift of noise power from the lower frequency section to the higher frequency section of the spectrum is obtained (in the English language literature indicated with the term "noise shaping") an output signal is obtained with, despite the smaller number of bits per word, a good perception quality for the human viewer thanks to the fact that the human eyesight has a built in "filter".

Although the above mentioned general embodiment of the system without too many additional means yields very useful results a further improvement is obtainable in case the slope in the noise spectrum, which in the general embodiment has a decline of 6 dB/octave, is made steeper.

The invention provides in this respect a system which furthermore comprises a second 1-bit coder, embodied to provide a shaped noise profile and to convert the residual words, which are generated together with said 1-bit words in the first 1-bit coder into a second series of 1-bit words, a differential stage for differentiating the second series of 1-bit words and a second accumulator circuit in which the differentiated 1-bit words are combined with the words produced by the first accumulator to obtain the desired PCM output signal, which system according to the invention is characterized in that also the frequency with which the residual words are converted by said second 1-bit coder is equal to said earlier mentioned repetition frequency.

This embodiment provides a "noise-shaping" of 12 db/octave.

Further embodiments and therewith obtained advantages will be discussed in more detail with reference to the attached drawings. The invention will be explained in more detail with reference to the attached drawings.

Figure 1:
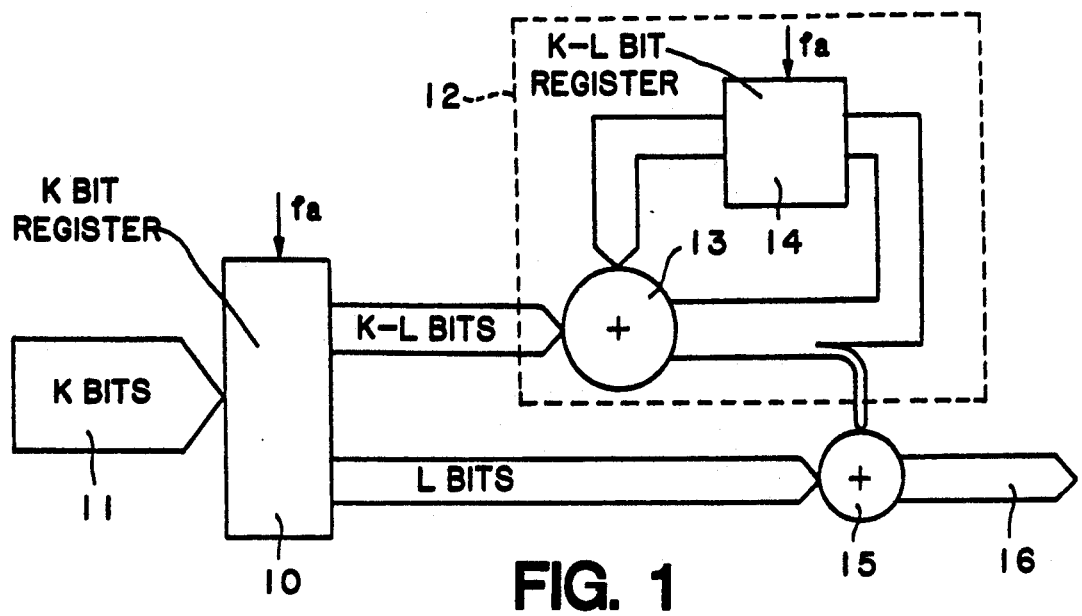
FIG. 1 illustrates a first embodiment of a system according to the invention comprising a 1-bit coder yielding into a noise profile with a slope of 6 db/octave.

FIG. 1 illustrates a first simple embodiment of a system according to the invention. The system comprises a register 10 for intermediately storing a series of PCM input words, supplied through the transmission path 11. The register is clocked with a frequency $f_a$, which is also the repetition frequency of the K-bit words in the PCM input signal. In the register the K-bits of each word are separated in the L most significant bits and the K-L least significant bits. The K-L least significant bits are subjected to a coding operation using a 1-bit coder 12. The coder 12 contains therefore a summing means 13 and a feedback register 14. Each word of K-L-bits, supplied to the circuit 12, is in the summing means 13 added to a word derived from the register 14. The K-L least significant bits of the resulting sum word are supplied again to register 14 and are temporarily stored therein whereas the most significant bit (the carry bit) functions as output signal of the 1-bit coder 12 and is supplied to a further summing means 15, in which this 1-bit carry signal is combined with the L most significant bits of the PCM input signal. The sum signal resulting therefrom forms in fact the desired PCM output signal, which is supplied to the output transmission path 16. This PCM output signal comprises words of L-bits. The result of the operation in the system according to FIG. 1 is therefore a reduction of K-bits per word to L-bits per word (L<K). Because the system uses no oversampling the incoming PCM signal on the transmission path 11 as well as the outgoing PCM signal on the transmission path 16 are situated within the baseband which extends between 0 Hz and $\frac{1}{2} f_a$ Hz.

The register 14, which is clocked with the same repetition frequency $f_a$ as the register 10, functions together with the summing means 13 in fact as a first order feedback filter. The result of the filter operation, which is carried out by this first order filter, is that the uniform noise spectrum in the K-bit PCM input signal in the input transmission path 11 is converted into a non-uniform noise spectrum on the output signal on the output path 16, which spectrum has an inclining character with a slope of 6 dB/octave.

Figure 2A:
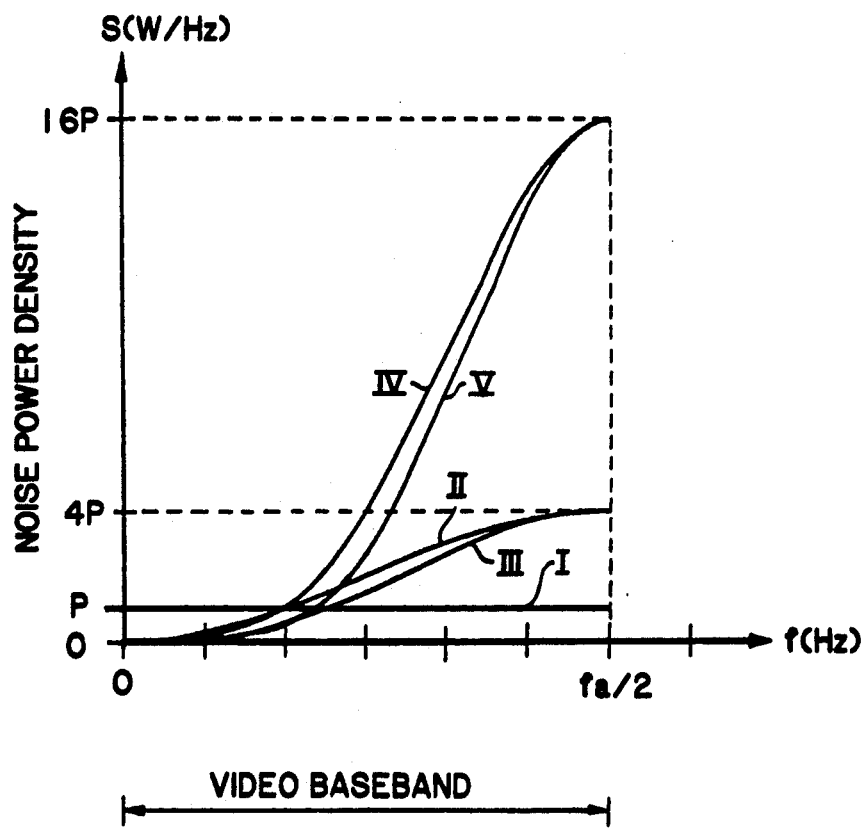
FIGS. 2A and 2B illustrate in two diagrams, which apart from the scale division are essentially equal to each other, some noise power density profiles.
Figure 2B:
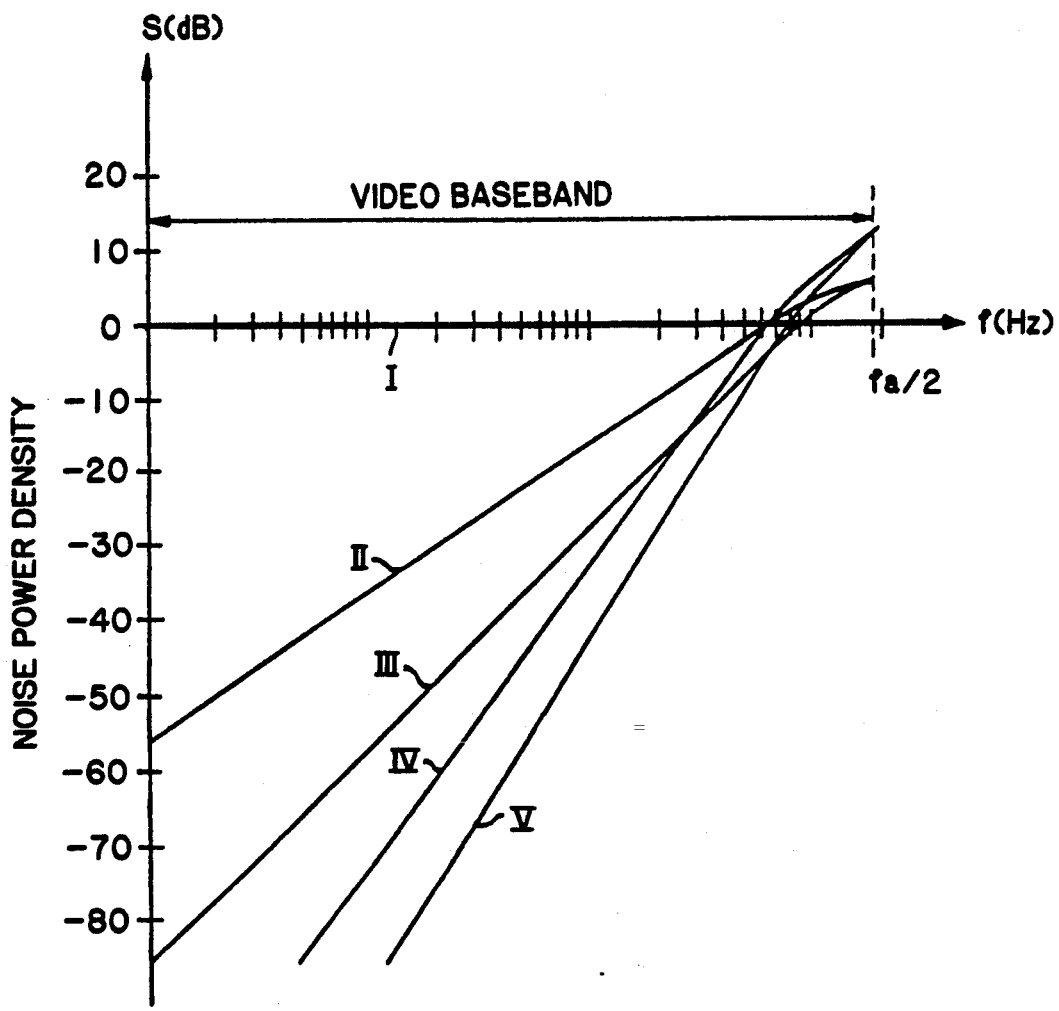

The FIGS. 2A and 2B supply more details about the noise power density S in the resulting PCM signal on the output transmission path 16. Both figures provides in essence the same information, however, with the difference that in both figures differing scale divisions are applied. In FIG. 2A a linear scall division is selected both for the horizontal axis as well as for the vertical axis. In FIG. 2B the same curves as in FIG. 2A are illustrated, however, in this case with a logarithmic division along both the horizontal axis and the vertical axis. In both figures the power density S is plotted against the frequency for a number of different situations which will be discussed hereinafter.

The linear curve I applies for the situation that the 1-bit coder does not carry out any filter operation. In that case a uniform noise spectrum over the complete frequency range will result. In FIG. 2A it is assumed that in that case the noise power density has value P. In FIG. 2B the corresponding curve I coincides with the 0-dB line.

However, if a 1-bit coder is applied in which a first order feedback filter is realized in the way as illustrated for instance in FIG. 1 then the power density profile II will be obtained, which profile has an inclined character with a slope of 6 dB/octave. As appears clearly from FIGS. 2A and 2B an important part of the noise power is now shifted to the higher frequencies. Especially FIG. 2B shows that the improvement of the signal to noise ration especially in the lower frequencies is significant. The power density level of the noise in the lower frequency section of the baseband is strongly decreased.

Because the human eyesight (the eyes combined with the processing capacity of the human brains) is relatively insensitive for the high frequency video signal parts and thanks to the filter action in the 1-bit coder the major part of the noise which is now present in the higher frequency section of the video baseband, a coding operation of the PCM input signal in the described manner an output signal with equal perception quality notwithstanding the fact that the number of bits per word is drastically reduced.

With a circuit, which was tested in practice, it appeared to be possible to convert an 8-bit linearly coded PCM video signal with uniform noise spectrum into a 5-bit PCM signal with non-uniform noise spectrum without noticeable detoriation of the perception quality.

An even further reduction of the amount of bits was realized with another circuit, also tested in practice, by means of which an 8-bit linearly coded PCM video signal with non-uniform noise spectrum was converted into a 3-bit PCM signal with non-uniform noise spectrum. Although a detoriation of the perception quality could be noticed, the picture was still sufficiently detailed and very acceptable for many applications. The obtained picture was certainly sufficient, for instance for surveillance purposes. Taking into account that for a 3-bit PCM signal assuming a standard sampling frequency of 13.5 MHz, a bit rate of approximately 40 Mbit/s is already sufficient, the application of the invention in a surveillance system will offer the possibility to use relatively simple and therewith cheap cables and transmission lines and relatively slow logic. Application of a 3-bit PCM signal furthermore results in a picture of which the contours are strongly attenuated. This contour attenuation is caused by the fact that there is as it were some movement in the picture, because not every pixel is unambiguously defined each time by the PCM signal. Inherently one obtains therewith protection against burning in phenomena on the image screen.

An improvement of the already very useful system according to FIG. 1 can be realized by steepening the slope in the noise profile, in other words, by effecting a stronger shift of noise power to the higher frequencies. A 1-bit coder with stronger filter action is illustrated in the FIG. 3. The coder 22 in FIG. 3 comprises between the input 20 and the output 21 a summing means 19, a first adder 23, a second adder 24, a comparator 26 and a time delay element 25. The sum signal of the first adder 23 is fed back through the time delay element 27 to the second input of the adder 23. The sum signal of the adder 24 is through a time delay element 28 and through an attenuation element 29 supplied to the second input of the adder 24. The output signal of the time delay element 25 is fed back to the summing point 19.

Figure 3:
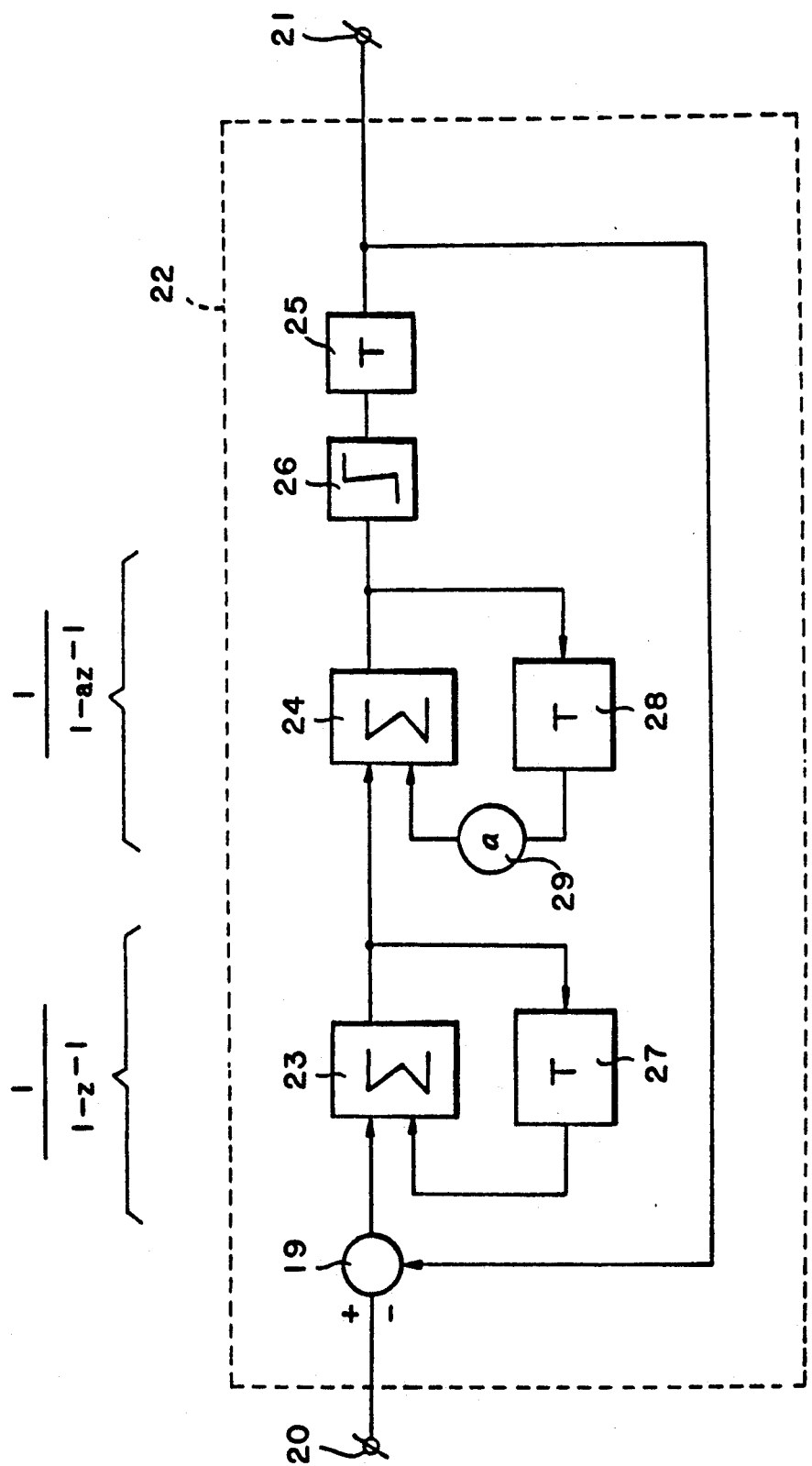
FIG. 3 illustrates an embodiment of an 1-bit coder which can be used for obtaining a profile with 9 db/octave.

As is indicated in FIG. 3 above the frame 22, with help of the first loop comprising the adder 23 and the delay element 27 a filter function as realized which in the Z-transform can be written as $(1-Z^{-1})^{-1}$. The second loop comprising the adder 24, the delay element 28 and the attenuation element 29 also realizes a filter function which, in the Z-transform can be written as $(1-aZ^{-1})^{-1}$. If for "a" a value is selected within the range $0 \leq a \leq \frac{1}{2}$ then a noise shaping with a slope of 9 db/octave will be obtained when this 1-bit coder is applied. In the FIGS. 2A and 2B the possible noise profile is indicated by the curve III. The improvement of the noise profile is specifically clear in FIG. 2B.

Figure 4:
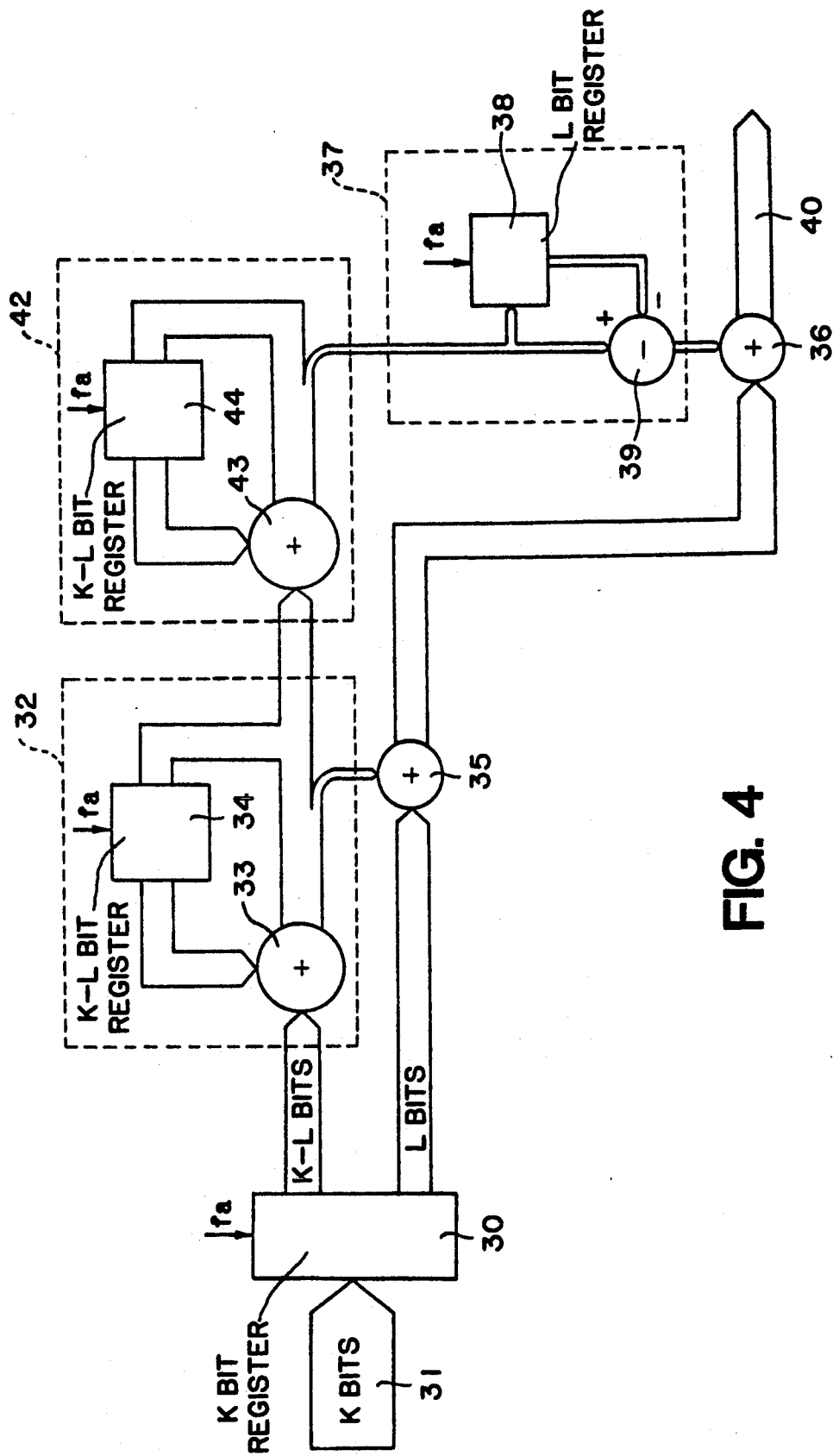
FIG. 4 illustrates an embodiment of a system according to the invention comprising two cascaded 1-bit coders, by means of which a profile of 12 db/octave can be realized.

From the state of the art (U.S. Pat. No. 4,593,271) a cascade circuit is known comprising two 1-bit coders in a series circuit. A similar cascade circuit can also be used within the scope of the invention. FIG. 4 illustrates an embodiment which will be discussed in more detail hereinafter.

In FIG. 4 a series circuit is illustrated of two 1-bit coders 32 and 42, both comprising a register 34, respectively 44 and both comprising an adder 33, respectively 43. Furthermore the system comprises an input register 30 destined to temporarily store the K-bit input words which will be supplied through the input transmission path 31. Both the register 30 as well as the registers 34 and 44 are clocked with the same clock pulse frequency $f_a$, which clock pulse frequency is equal to the repetition frequency which is used in the PCM input signal.

Just like the register 10 in FIG. 1, also the register 30 takes care of separating the K-L least significant bits from the L most significant bits. The K-L least significant bits are supplied to the 1-bit coder 32 and the functioning of this part of the circuit in FIG. 4 is completely identical to the function of the coder 12 in FIG. 1. The carry bit at the output of the adder 33 is, in a similar manner as in FIG. 1, supplied to the adder 35 and combined with the L most significant bit resulting into a new L-bit output signal which, as is illustrated in FIG. 4 is supplied to the adder 36. Apart from the carry bit the output signal of the adder 33 is supplied to the second 1-bit coder 42. In this 1-bit coder 42 the signal is again subjected to a 1-bit coding operation and the therefrom resulting carry bit is supplied to a filter circuit 37 formed by a register 38 and a subtractor 39. In Z-transform notation the circuit 37 carries out the filter function $(1-Z^{-1})$. The two bits resulting therefrom are combined in the adder 36 with the output signal of the adder 35 resulting into the desired PCM output signal of L-bits, which is delivered to the output transmission path 40. It is remarked, that also the register 38 is clocked with the same repetition frequency $f_a$ with which also the words in the input signal on the input transmission path 31 are supplied.

By applying a cascade circuit of two 1-bit coder 32 and 42 a slope of the +12 db/octave is obtained in the shaping of the noise power density S. In the FIGS. 2A and 2B the obtained noise profile is indicated with the curve IV. Thanks to the even stronger shift of noise power to the higher frequency section of the spectrum and thanks to the relative insensitivity of the human eyesight for this higher frequency section the circuit in FIG. 4 is suited to produce a PCM video signal with a relatively low number of bits, whereas on the other hand the perception quality of the signal in comparison with the original PCM signal is not or hardly influenced. By applying two cascaded 1-bit coders one obtains the additional effect that the quantization noise is almost completely not correlated with the input signal.

In a variant of FIG. 4 the 1-bit coder 42 can be replaced by an embodiment of a coder as illustrated in FIG. 3. Therewith an even steeper increase of the noise profile can be realized with a slope of +15 db/octave. The noise profile which is obtained in that case is illustrated with the curve V in the FIG. 2A and 2B. The FIGS. 3 and 4 offer enough support for the expert in this field to enable him to realize such a circuit and therefore this embodiment is not illustrated in a separate figure.

It is assumed above that the words, which are supplied from the output of the adder 23 to the one input of the adder 43 have an average value 0. If these words contain a large number of bits and if a large degree of oversampling is applied, as is the case in the above cited state of the art, then this assumption is correct apart from a very small error. However, if a digital character representation is used with a relatively small number of bits and if no oversampling is applied, as is the case in the system according to the invention, then this assumption is not correct. If use is made of the 2-complement then these words, which from the adder 33 are applied to the adder 41, will have an average value of minus an halve least significant bit. The consequence thereof is that still more noise will remain in the lower frequency section of the baseband than might be expected. To correct this it is preferred to add permanently the value of an halve LSB to the words which from the adder 33 are supplied to the adder 43. An embodiment of the system in which such an addition is realized is illustrated in FIG. 5.

Figure 5:
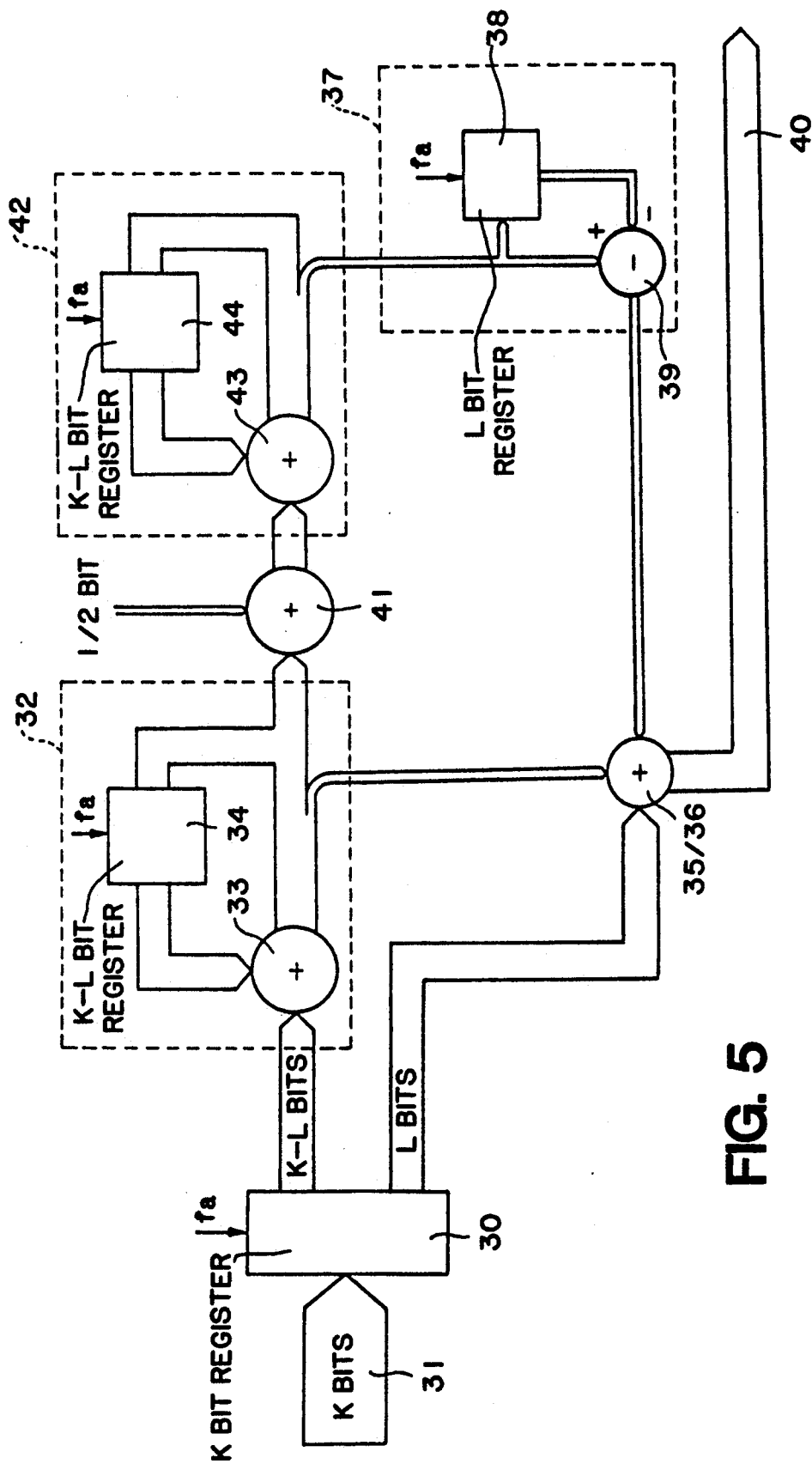
FIG. 5 illustrates a further development of the system according to FIG. 4.

The embodiment of FIG. 5 is for the major part identical to the embodiment in FIG. 4. The first difference is to be found in the signal path along which the residual value words from the 1-bit coder 32 are transported to the 1-bit coder 42. In FIG. 5 a further adder 41 is inserted in this signal path, the purpose of this adder being to add a constant value of an halve bit to the digital values which from the coder 32 are supplied to the coder 42. The addition of an halve bit is carried out by alternatively adding nothing and adding a least significant bit to the words in the signal string. A further difference between FIGS. 4 and 5 is formed by the application of only one single summing means 35/36 instead of both adders 35 and 36 in FIG. 4. It will be clear that the combination of both adders may lead to an hardware saving. It is furthermore remarked that with the application of the circuit according to FIG. 5 there is not correlation anymore between the quantization noise and the input signal.

In the above description it is furthermore assumed that the addition of 1-bit to the L most significant bits in the adder 15 (FIG. 1) or in the adders 35 and 36 (FIGS. 4 and 5) will lead to a result which also has a value of L-bits. However, the addition in the adder 15 (FIG. 1) or the adder 35 (FIG. 4) may lead to a maximum value at the output of the respective adder which is equal to $2^L$, in other words one bit more than desired. Because the subtraction means 39 may deliver a value which, in absolute sense, varies between $-1$ and $+2$ the addition in the adder 36 may lead to a maximum value $2^L+1$ or a minimum value of $-1$. To obtain an ultimate result which has at the maximum L-bits, it is in the embodiment of FIG. 1 preferred that the L-bits, which in the register 10 are separated from the incoming K-bits, cover a range which is formed by the binary values: $\{0, 1, 2, \ldots (2^L-2)\}$. After the adder 15 the desired range of numbers will be obtained: $\{0, 1, 2, \ldots (2^L-1)\}$.

In the embodiment of the FIGS. 4 and 5 it is preferred in this respect to restrict the range of values which might be covered by the L-bits, which in the register 30 are separated from the incoming K-bits to: $\{0, 2, \ldots (2^L-3)\}$. Also in this case the desired range of numbers will be obtained at the output of the adder 36 (or 35/36 in FIG. 5): $\{0, 1, 2, \ldots (2^L-1)\}$.

Above it is assumed that all words in the PCM signal on the incoming transmission path 11 respectively 31 are treated in a system according to the invention in the normal time order in which the words successively appear in the PCM signal. As example a television signal is considered which is generated on the basis of the generally accepted television standard in which each image is composed of horizontal lines which are written successively from top to bottom on the screen, whereby the pixels in each line are written from left to right. In that case the operation in the system according to the invention is each time carried out with words which are representing horizontally adjaced elements or pixels. It is remarked that in this description the term "picture element" or "pixel" is meant to characterize an elementary part of the image represented by one single PCM word.

In FIG. 6 some image lines K, L, M and N are schematically illustrated, being positioned directly underneath each other. The pixels in each line are arranged in vertical columns, of which the columns 10 until 20 are illustrated in FIG. 6. Referring to FIG. 6A in a PCM television signal, configurated according to the generally accepted television standard, successive words are received which are representing the pixels K10, K11, K12..., L10, L11, L12..., M10, M11, M12..., N10, N11, N12... These words are in agreement with the above described procedure successively supplied in said order to the system according to the invention so that the conversion of the words will take place in the direction of, the arrow 51 in FIG. 6.

Figure 6A:
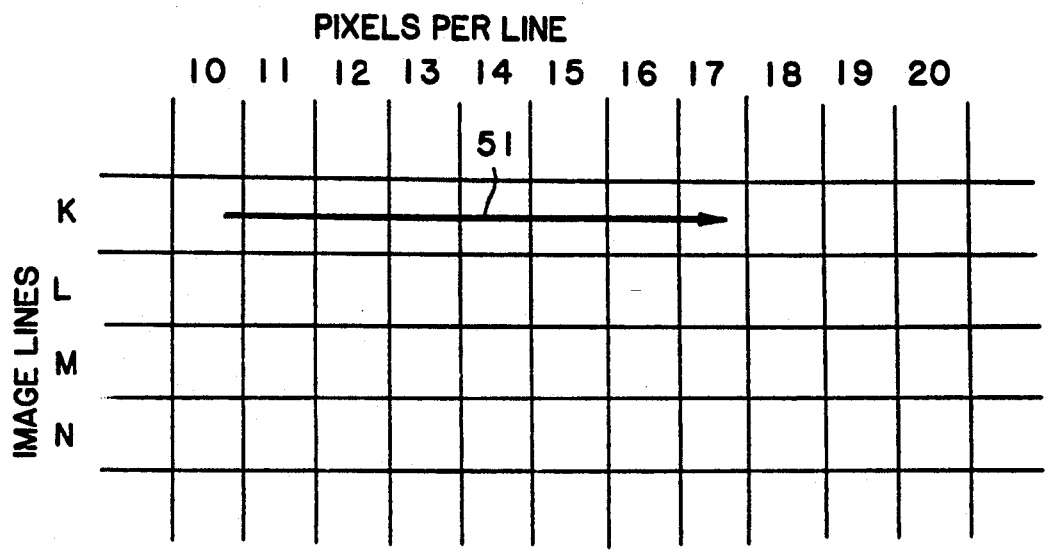
FIGS. 6a to 6e illustrate a number of different ways to process the information concerning pixels in a video image, using the system according to the invention.
Figure 6B:
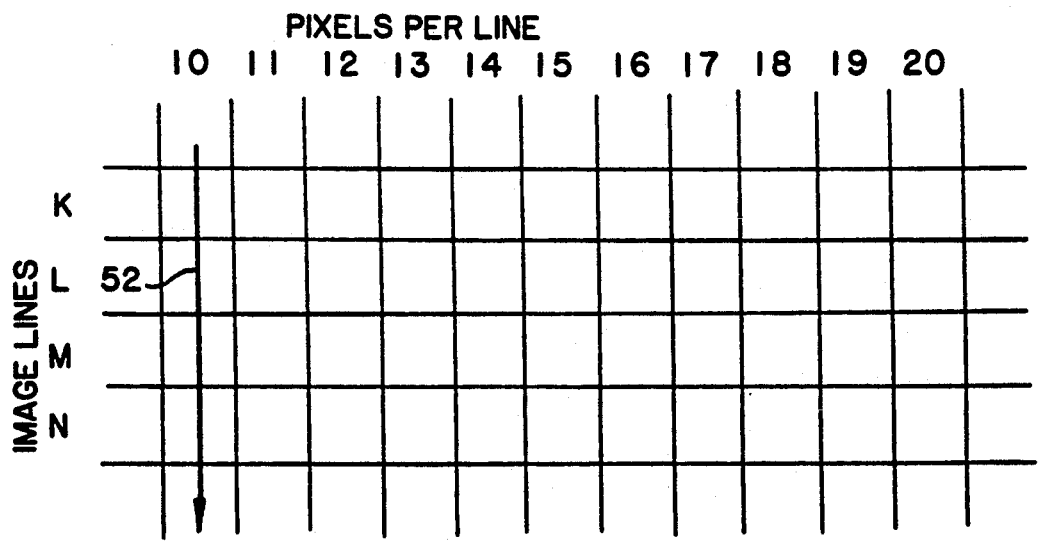

However, it is also possible to carry out the conversion process in another direction, for instance in a vertical direction. FIG. 6B illustrates the same section from the complete image in which now the vertical arrow 52 is illustrated. It will be clear that, if the system according to invention has to carry out an operation on the incoming PCM words in that direction, successive words related to the pixels K10, L10, M10, N10, ... K11, L11, M11, N11, ... will have to be supplied to the system. A possible embodiment of a system for realizing such an operation is illustrated in FIG. 7.

Figure 7:
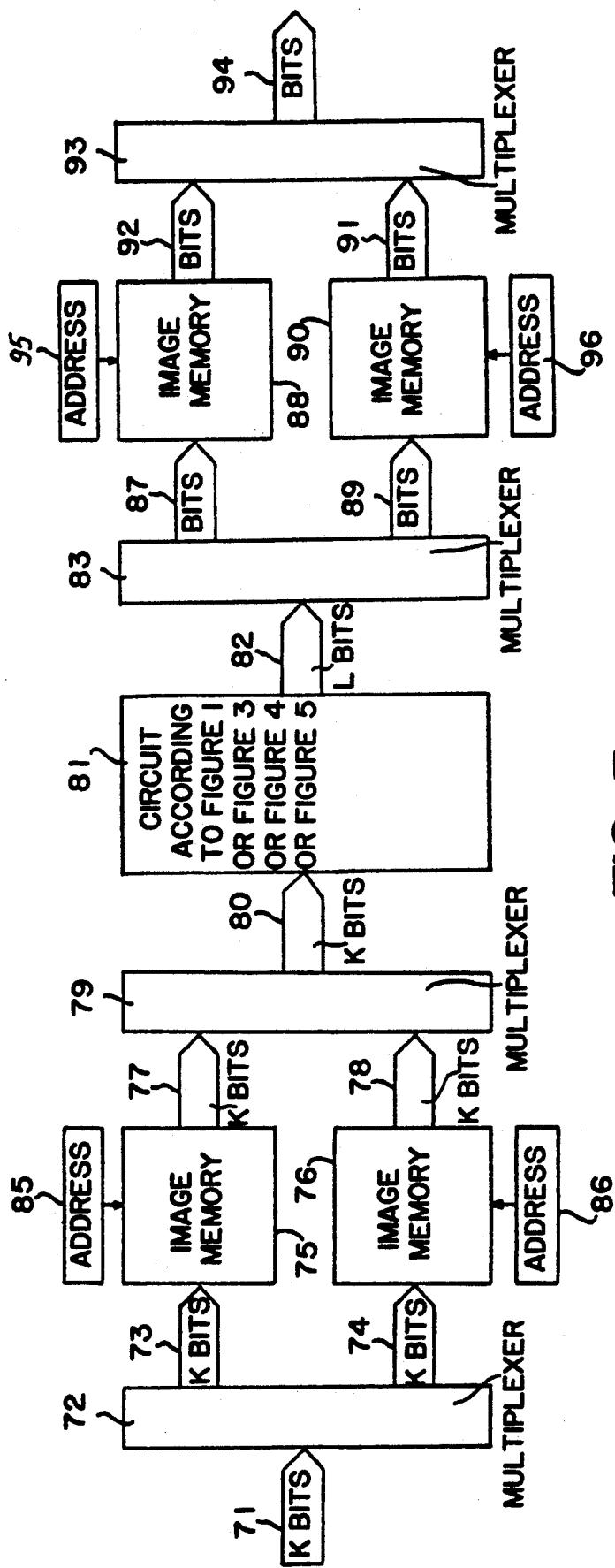
FIG. 7 illustrates a system destined to carry out the processes of which examples are illustrated in FIG. 6.

The system in FIG. 7 comprises a multiplexer 72 which receives the PCM input words from the transmission path 71 and supplies them either through the path 73 to a first image memory 75 or through the path 74 to a second image memory 76. The functioning of the multiplexer 72 is such that each time one of the image memories 75 or 76 will be filled with PCM words related to one complete image, whereafter the process is switched over to the other image memory. During the period in which PCM words are inputted in one of the image memories the PCM words are read from the other image memory and supplied to the actual coding unit.

For that purpose the system comprises a further multiplexer 79 which is able to receive PCM words through the route 77 from the image memory 75 and through the information route 78 from the image memory 76 and is furthermore able to supply these PCM words through the route 80 to the circuit 81. The circuit 81 can be a circuit as illustrated in FIG. 1, FIG. 3, FIG. 4 or FIG. 5, being a circuit suitable for converting the K-bit words, supplied through the route 80, into L-bit words which are delivered to path 82.

The addressing units 85 respectively 86 related to each image memory 75, respectively 76 are functioning preferably such that during the storing of PCM words related to a new image in the respective image memory locations are addressed in a predetermined order such that the words are successively stored in the normal frame order. After storing these words, related to a complete image, in the memory said words are read out during the following image reception period, whereby the order in which they are read out, can be different from the order in which they were stored, dependent on the manner in which the operation has to be carried out. If the operation should be carried out in vertical direction in the way as schematically indicated in FIG. 6B then the related memory, for instance 75, should be addressed by the corresponding addressing 85 such that successively the PCM words corresponding to the pixels K10, L10, M10, N10, ... K11, L11, M11, N11, ... are read out and supplied through the path 77, the multiplexer 79 and the path 80 to the conversion system 81. During the period, this process is carried out, the respective other memory in this example the memory 76 is through the multiplexer 72 and the path 74 loaded with PCM words which are related to the next image and which are received through the path 71.

The L-bit words at the output of the circuit 81 are not appearing in the correct time sequence for controlling a television receiver. To rearrange the words in the correct order again, the words through the path 82 supplied to a further multiplexer 83 which sends all words, related to a complete image, through route 87 to a memory 88 or through route 89 to a memory 90. Whereas in this manner the one memory (88 or 90) is filled, the respective other memory (90 or 88) is read out and the read out information is through the path 91 or 92 and through the multiplexer 93 supplied to the output path 94. Both memories 88 and 90 are respectively addressed by addressing units 95 and 96. These addressing units are operating such that either during the filling of a image memory or during the read out of the image memory the correct order of the words is reestablished. The way in which this can be realized is considered as known to the expert in this field and therefor a further detailed explanation is considered superfluous.

Not only an operation in horizontal or vertical direction is possible, also an operation in an arbitrary other direction or an operation according to a predetermined pattern can be realized.

Figure 6C:
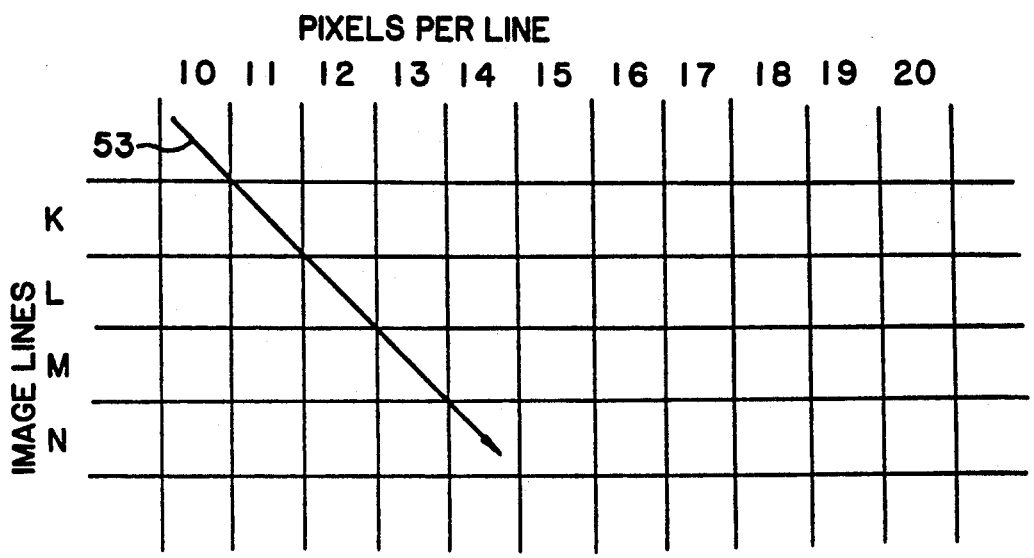
Figure 6D:
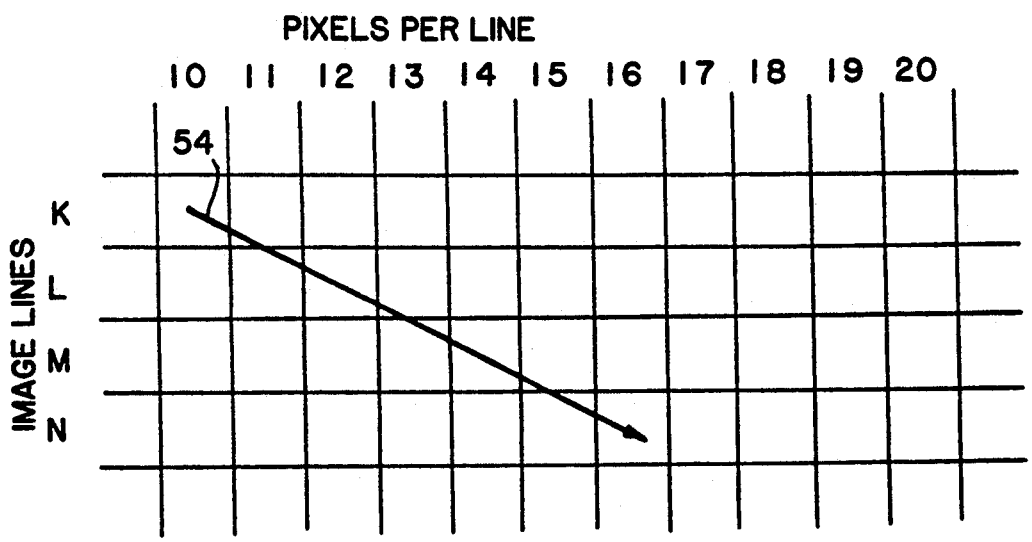

In FIG. 6C schematically an operation in diagonal direction is illustrated. In case successively the words related to the pixels K11, L12, M13, N14 ... K12, L13, M14, N15 ... are read out than the operation in the system 81 will be carried out in a diagonal direction. If the related addressing unit 85, 86 is operating such that successively the words related to the pixels K10, L12, M14, N16 ... K11, L13, M15, N17 ... are supplied to the system 81 then an oblique image operation is obtained in the direction of the arrow 54 in FIG. 6D.

Figure 6E:
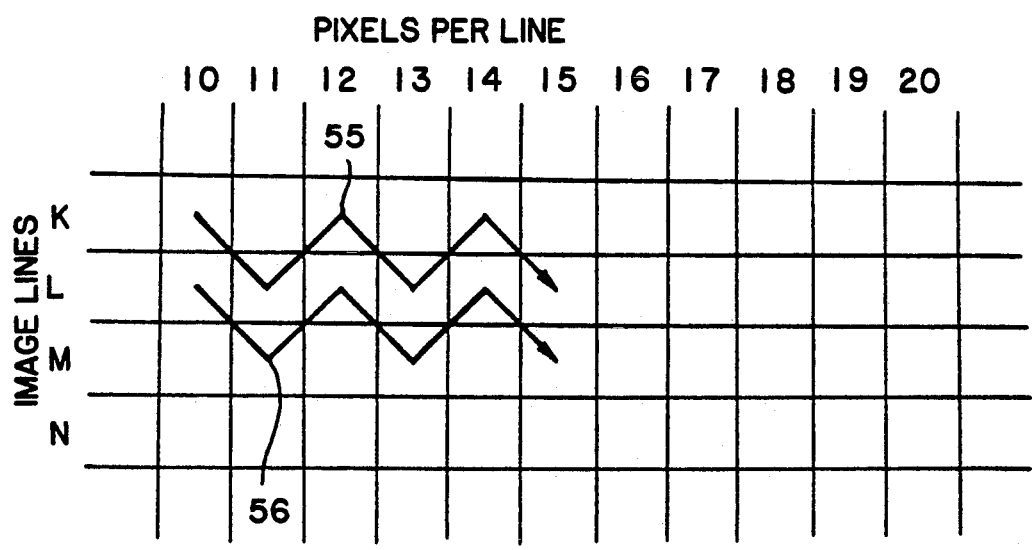

A possible pattern operation is illustrated in FIG. 6E by means of the arrows 55 and 56. The pixels are read from the respective image memory 75 or 76 in the order K10, L11, K12, L13, K14, L15, ... L10, M11, L12, M13, L14, M15, ... Therewith an operation both in horizontal direction as well as in vertical direction is obtained.

It will be clear that also much more complicated pattern operation are possible whereby arbitrary successions of words are read out from the memory, as long as care is taken that all PCM words, which are related to the picture are read out and that each word is only read out only once.

Although FIG. 7 illustrates a generally applicable circuit this circuit has the disadvantage of four relatively large image memories necessary to obtain proper functioning of the circuit. These image memories are not necessary in all cases. Dependent on the desired operation direction it is possible to apply much simpler circuits. An example thereof is illustrated in FIG. 8.

Figure 8:
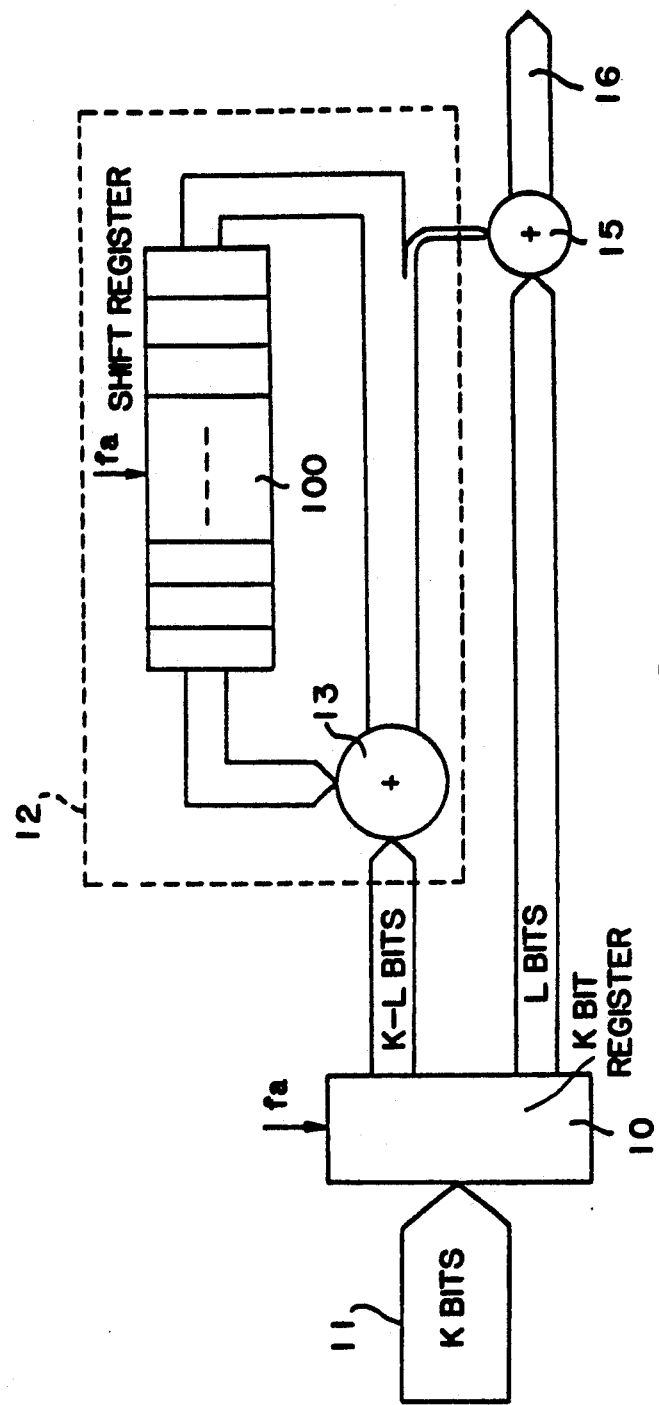
FIG. 8 illustrates a simplified embodiment of a system for carrying out the processes of the type illustrated in FIG. 6.

FIG. 8 illustrates a circuit which shows lots of correspondences with the circuit in FIG. 1. The components 10, 11, 12, 13, 15 and 16 are also present in FIG. 8 and have in principle the same function as in the circuit according to FIG. 1. The difference between FIG. 1 and FIG. 8 is found in the register which is present in the coder 12. In FIG. 1 a 1-bit register 14 was used whereas in FIG. 8 an n-stage shift register 100 is used. This shift register 100 is clocked again with a frequency $f_a$ being equal to the repetition frequency of the K-bit words in the incoming PCM input signal. If the number of stages n in the shift register 100 is equal to the number of pixels or picture elements in one complete image line then the coding process in the coder 12 will be applied to the K-L least significant bits of a predetermined pixel and the residual value of the pixel positioned vertically above. Said last mentioned residual value is in fact delayed over one line period in the register 100. Instead of a large number of relatively large scale components in the circuit according to FIG. 7 it is therefor possible with only one n-stage shift register 100 to carry out a coding operation in vertical direction.

If the number of stages n in the shift register is selected equal to the number of pixels in an image line +1 pixel then the K-L bits of each word will be combined with the residual value with the word corresponding to the diagonally higher positioned pixel. In other words, an operation in diagonal direction is carried out. An operation in the other diagonal direction can be realized in case the number of stages n in the shift register 100 is selected equal to the number of pixels in a complete image line −1 pixel.

If the number of stages n in the shift register 100 is selected to such a value that in the shift register a delay of one complete image can be realized then in fact the operation is carried out on corresponding pixels in successive images. Therewith an averaging of the image information is obtained which especially will lead to a sharpening of the image contours, improving therewith the quality of the image.

It is remarked that an averaging of two or more images is also possible by, preceding the operation in the system according to the invention, adding the PCM words which describe corresponding picture elements from a number of successive images, eventually after multiplication with weight factors, and supplying the resulting sum word to a system according to the invention. The system according to the invention offers thereby, in comparison with techniques whereby first an addition is carried out followed by a division, the advantage that no round off errors will appear so that less information will become lost.

It is also possible to select the number of stages n of the shift register 100 equal to the number of pixels in a complete image +1 pixel or −1 pixel, in which case a horizontal direction of operation is created on pixels belonging to successive images. A vertical direction of operation on pixels of successive images can be obtained in case the number of stages n in the shift register 100 is selected equal to the number of pixels in a complete image plus the number of pixels in an image line.

Instead of a delay over a complete image period it is of course also possible to select the number of stages in the shift register 100 such that a delay over one frame period is obtained.

It is remarked that the application of a multistage shift register instead of a one stage shift register in the first 1-bit coder can be realized in the circuits illustrated in the FIGS. 3, 4 and 5. In the three figures the registers 23 and 34 should be replaced in that case by a shift register with the desired number of stages. The first 1-bit coder 24 respectively 42 remains unchanged.

In the above described embodiments, especially the examples described with reference to the FIGS. 6, 7 and 8, a video information is assumed which is structured according to a generally accepted TV-standard, according to which standard the image is built up from frames whereby each frame comprises a number of horizontal lines. However, it is also possible to apply the above described method to video information which is structured according to a completely different standard, for instance video information which is configured as in radar systems, display systems etc.

Although the invention is described above in detail with reference to a number of specific embodiments it will be clear that the invention is not restricted thereto and that various modification and changes can be made within the scope of the invention.

I claim:

1. Circuit for converting a PCM input signal with uniform noise spectrum, comprising a series of digital words each of K-bits appearing with a predetermined repetition frequency, into a PCM output signal with a non-uniform noise spectrum comprising a series of digital words each of L-bits, L being smaller than K, which system comprises at least a first 1-bit coder embodied to provide a shaped noise profile and to convert the K-L least significant bits of each word from the input signal into a series of 1-bit words, and a first accumulator for combining said 1-bit words with the L most significant bits resulting into the desired PCM output signal, wherein the frequency with which said K-L least significant bits of the words of the input signal are converted by said 1-bit coder is equal to said earlier mentioned repetition frequency.

2. Circuit according to claim 1, further comprising a second 1-bit coder, embodied to provide a shaped noise profile and to convert the residual words, which are generated together with said 1-bit words in the first 1-bit coder into a second series of 1-bit words, a differential stage for differentiating the second series of 1-bit words and a second accumulator in which the differentiated 1-bit words are combined with the words produced by the first accumulator to obtain the desired PCM output signal, wherein the frequency with which the residual words are converted by said second 1-bit coder is equal to said earlier mentioned repetition frequency.

3. Circuit according to claim 2, wherein the second 1-bit coder comprises between the input and output thereof a series circuit of a summing point, two cascaded adders each comprising a feedback circuit containing a register, whereby in the feedback circuit of the second adder besides said register further including an attenuating element, a comparator and a time delay element, whereby the output of said comparator is fed back to said summing point.

4. Circuit according to claim 3, wherein during operation the attenuating element is set to an attenuation between 0 and $\frac{1}{2}$.

5. Circuit according to claim 2, wherein the first and second accumulator comprises one single adder circuit.

6. Circuit according to claim 2, wherein between the first and second 1-bit coder a further adder is inserted for adding the value of one half of the least significant bit to each residual value word which is supplied from the output of the first 1-bit coder to the input of the second 1-bit coder.

7. Circuit according to claim 1, wherein the 1-bit coder comprises an adder and a n-stage shift register, which shift register operates with said repetition frequency, whereby the K-L least significant bits in the adder are added to the value received from the last stage of said shift register, whereby the carry-output of said adder delivers the desired 1-bit word and whereby the K-L remaining bits are supplied to the first stage of the shift register.

8. Circuit according to claim 7, wherein the PCM input signal is a videosignal and that the number of stages n of the shift register is equal to the number of PCM words necessary to describe all the pixels in a complete image line.

9. Circuit according to claim 7, wherein the PCM input signal is a videosignal and that the number of stages n of the shift register is equal to the number of PCM words necessary to describe all pixels of a complete image line plus or minus one pixel.

10. Circuit according to claim 7, wherein the number of stages n of the shift register is equal to the number of PCM words necessary to describe all pixels of a complete image.

11. System for converting a PCM input signal with a uniform noise spectrum, comprising a series of digital words each of K-bits appearing with a predetermined repetition frequency, into a PCM output signal with a non-uniform noise spectrum, comprising a series of digital words each of L-bits, L being smaller than K, which system comprises a circuit according to claim 1 preceded by a buffer stage of which the input is connected to an input transmission path and of which the output is connected to the input of said circuit, which buffer circuit receives a series of PCM words from said transmission path, buffers these words in a buffer memory and, after storing a predetermined amount of words in said buffer memory, reads the words from said buffer memory in a predetermined order, which can be different from the order in which the words were stored, and supplies said words to the respective system, and followed by a second buffer circuit of which the input is connected to the output of said circuit, which buffer circuit receives the converted PCM words, stores these words temporarily in a second buffer memory and, after a predetermined amount of words is stored in said buffer memory, reads said words in a predetermined order from this second buffer memory and delivers the words to the output transmission path such that the order of the words on the input transmission path is the same as the order on the output transmission path.

12. Circuit according to claim 1, wherein the first 1-bit coder comprises between the input and output thereof a series circuit of a summing point, two cascaded adders each comprising a feedback circuit containing a register, whereby in the feedback circuit of the second adder besides said register further including an attenuating element, a comparator and a time delay element, whereby the output of said comparator is fed back to said summing point.

13. Circuit according to claim 12 wherein during operation the attenuating element is set to an attenuation between 0 and $\frac{1}{2}$.

* * * * *